(12) United States Patent
Noble

(10) Patent No.: US 7,212,408 B2
(45) Date of Patent: May 1, 2007

(54) MULTI-SLOT SOCKET FOR MOUNTING INTEGRATED CIRCUITS ON CIRCUIT BOARD

(75) Inventor: Scott Noble, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 276 days.

(21) Appl. No.: 11/024,058

(22) Filed: Dec. 28, 2004

(65) Prior Publication Data

US 2006/0139884 A1 Jun. 29, 2006

(51) Int. Cl.
*H05K 7/20* (2006.01)
*H01R 12/00* (2006.01)

(52) U.S. Cl. ............... 361/719; 361/715; 361/722; 439/71; 439/485

(58) Field of Classification Search ............... None
See application file for complete search history.

(56) References Cited

U.S. PATENT DOCUMENTS

| | | | | |
|---|---|---|---|---|
| 5,303,121 A * | 4/1994 | Thornberg | .................. | 361/760 |
| 5,694,297 A * | 12/1997 | Smith et al. | ................. | 361/785 |
| 5,710,733 A * | 1/1998 | Chengson et al. | ............ | 365/52 |
| 5,867,419 A * | 2/1999 | Chengson et al. | ............ | 365/63 |
| 6,219,239 B1* | 4/2001 | Mellberg et al. | ............ | 361/704 |
| 6,626,681 B2* | 9/2003 | Chiu | ........................... | 439/70 |
| 6,634,095 B2* | 10/2003 | Colbert et al. | ................. | 29/740 |
| 6,642,064 B1* | 11/2003 | Terrill et al. | .................. | 438/15 |
| 6,705,878 B2* | 3/2004 | Liang | ........................ | 439/76.1 |
| 6,757,965 B2* | 7/2004 | Colbert et al. | ................. | 29/836 |
| 6,824,396 B2* | 11/2004 | Koopman et al. | ............ | 439/71 |
| 6,945,788 B2* | 9/2005 | Trout et al. | ................... | 439/66 |
| 6,971,887 B1* | 12/2005 | Trobough | ..................... | 439/71 |
| 7,059,869 B2* | 6/2006 | Wertz et al. | .................. | 439/71 |
| 7,133,287 B2* | 11/2006 | Campini et al. | ............ | 361/719 |
| 2004/0012934 A1* | 1/2004 | Jafari et al. | ................. | 361/760 |

* cited by examiner

*Primary Examiner*—Boris Chervinsky
(74) *Attorney, Agent, or Firm*—Buckley, Maschoff & Talwalkar LLC

(57) ABSTRACT

An apparatus includes a socket and a dynamic random access memory (DRAM) module installed in the socket.

7 Claims, 6 Drawing Sheets

MULTI-SLOT SOCKET FOR MOUNTING INTEGRATED CIRCUITS ON CIRCUIT BOARD

BACKGROUND

Space on circuit boards is increasingly at a premium. For example, trends in personal computing call for small form factor systems with ever increasing performance. At the same time, higher integrated circuit (IC) operating rates and greater device density on ICs leads to increased requirements for heat dissipation and for power delivery. This in turn tends to take up additional space on circuit boards.

DETAILED DESCRIPTION

Figure 1:
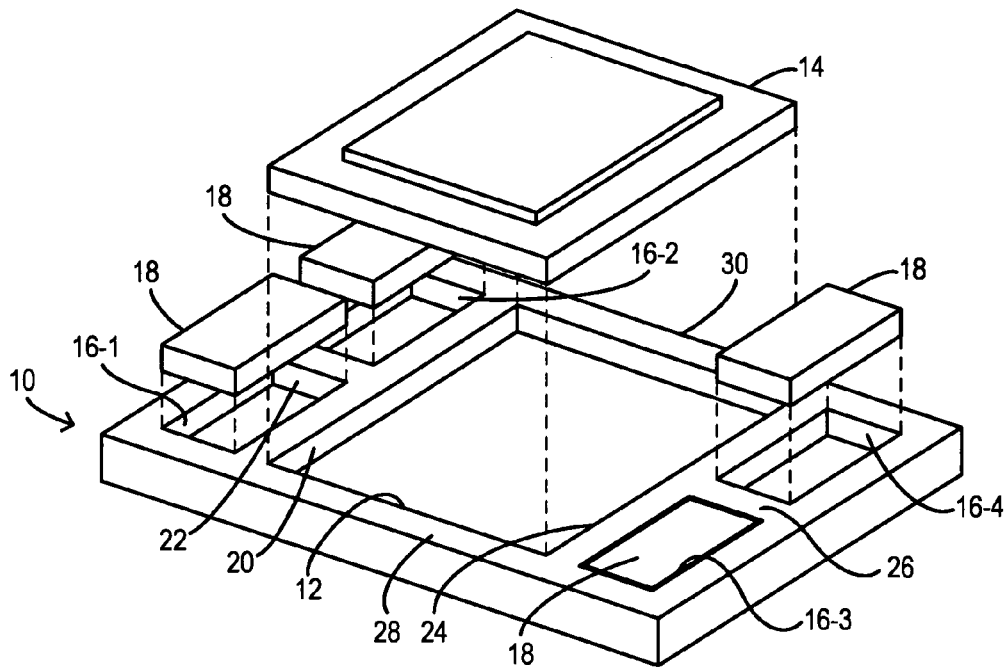
FIG. 1 is a partially exploded view showing a socket provided according to some embodiments together with some ICs to be installed in the socket.

FIG. 1 is a partially exploded view showing a land grid array (LGA) socket 10 provided according to some embodiments together with some ICs to be installed in the LGA socket 10. It will be observed that the LGA socket 10 includes five slots, each of which is shaped and sized to receive a respective IC. In particular the LGA socket 10 includes a central slot 12 which is shaped and sized to receive a microprocessor package 14, and additional slots 16-1, 16-2, 16-3 and 16-4, each of which is shaped and sized to receive a respective one of DRAM (dynamic random access memory) memory modules 18. Each of the slots 12, 16 may be formed as a rectangular recess in the LGA socket 10 and may have a floor which has thereon contact fingers (not separately shown) or the like such as are conventionally provided in LGA sockets.

The central slot 12 has a first side wall 20 that the central slot 12 shares with the memory module slots 16-1 and 16-2. The memory module slots 16-1 and 16-2 are adjacent to each other and share a common wall 22 that extends perpendicularly relative to the first side wall 20 of the central slot 12.

The central slot 12 also has a second side wall 24 that is parallel to and opposite to the first side wall 20. The central slot 12 shares its second side wall 24 with the memory module slots 16-3 and 16-4. The memory module slots 16-3 and 16-4 are adjacent to each other and share a common wall 26 that extends perpendicularly relative to the second side wall 24 of the central slot 12. The wall 26 shared by slots 16-3, 16-4 is aligned with the wall 22 shared by slots 16-1, 16-2.

The memory module slots 16-1, 16-2 are separated from memory module slots 16-3, 16-4 by the central slot 12. The central slot 12 also has a third side wall 28 that extends from one end of first side wall 20 to a corresponding end of the second side wall 24. In addition, the central slot 12 has a fourth side wall 30 that extends from an opposite end of the first side wall 20 to a corresponding end of the second side wall 24. It will be noted that the memory module slots 16-1 and 16-2 are on the opposite side of central slot 12 from the memory module slots 16-3, 16-4. The walls 28, 30 are parallel to each other and to walls 22, 26.

In some embodiments, the memory modules 18 may be conventional. For example, each memory module 18 may include a package in which two or more DRAM dies (not shown) are stacked.

It may be advantageous for the microprocessor (not separately shown) of the microprocessor package 14 to have integrated therewith the functionality of a memory controller hub (MCH). The MCH portion (not separately shown) of the microprocessor may be arranged to provide four memory channels—one for each of the four memory modules 18. The data/addressing connections (not shown) between the microprocessor package 14 and the memory modules 18 may be provided via the LGA socket 10. As a result, there may be a substantial reduction in the amount of trace routing required on the motherboard (not shown). With the reduction in required routing, and also the overall compact configuration of the LGA socket 10, it may be possible to realize substantial savings in motherboard space, perhaps on the order of 15 square inches, as compared to a conventional arrangement for mounting memory devices on a motherboard.

Figure 2:
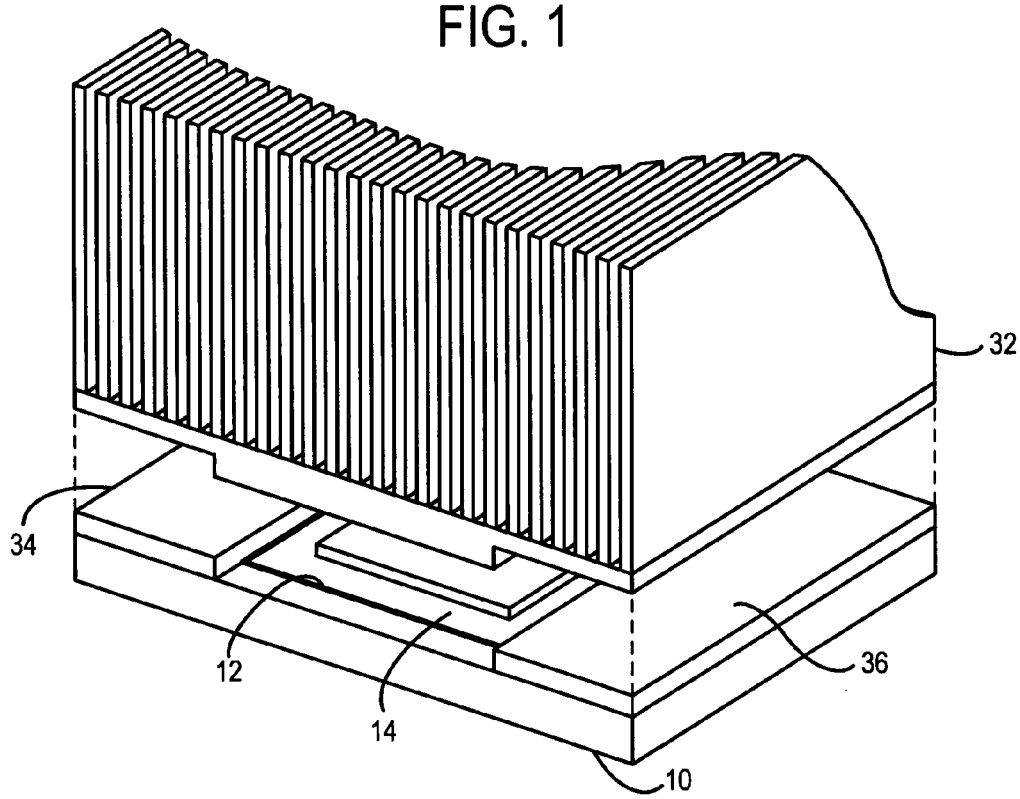
FIG. 2 is a partial and partially exploded view showing the socket of FIG. 1 together with a heat sink to be secured to the socket.

FIG. 2 is a partial and partially exploded view showing the LGA socket 10 together with a heat sink 32 to be secured to the LGA socket 10. It will be appreciated that the LGA socket 10 may be mounted on a circuit board (not shown) such as a motherboard. The microprocessor package 14 is shown installed in the central slot 12 of the LGA socket 10. Each of the memory modules 18 (not visible in FIG. 2) is installed in a respective one of the slots 16-1, 16-2, 16-3, 16-4 (not visible in FIG. 2). A spacer/heat spreader 34 is positioned over slots 16-1, 16-2, and a spacer/heat spreader 36 is positioned over slots 16-3, 16-4. The spacer/heat spreaders 34, 36 may compensate for the difference in height between the microprocessor package 14 and the memory modules 18, and also may thermally couple the memory modules 18 to the heat sink 32.

Figure 3:
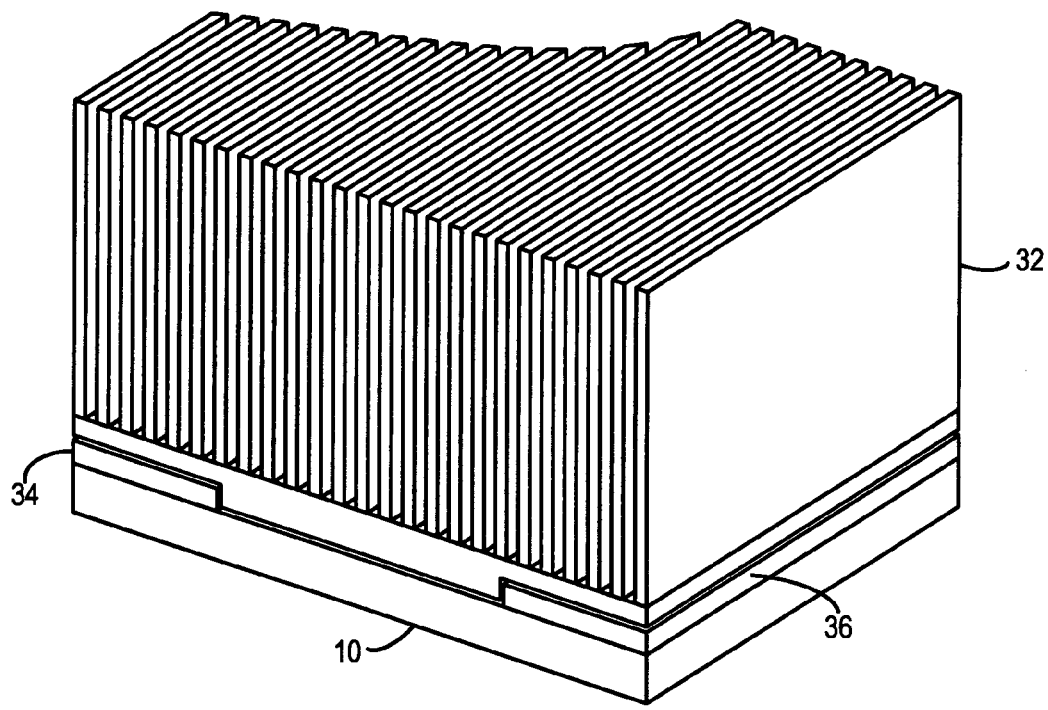
FIG. 3 is an isometric view showing the heat sink secured to the socket.

FIG. 3 is an isometric view showing the heat sink 32 secured to the LGA socket 10. The heat sink 32 may be secured to the LGA socket 10 by fasteners (not shown) such as screws and may serve to clamp the microprocessor package 14 and the memory modules 18 in their slots in the LGA socket 10 to assure positive electrical coupling between contacts (not shown) on the microprocessor package 14 and the memory modules 18 and contacts (not shown) in the slots of the LGA socket 10.

Figure 3A:
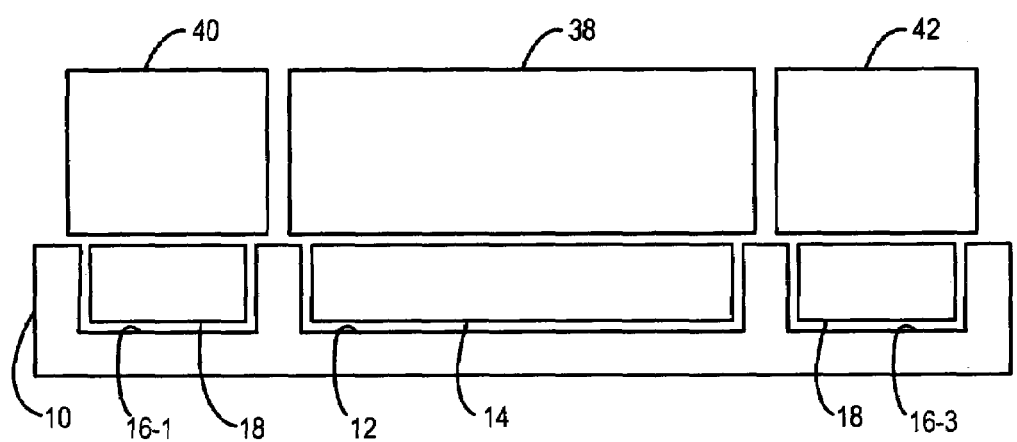
FIG. 3A is a schematic side cross-sectional view of an alternative embodiment that includes the socket of FIG. 1.

In the embodiment of FIGS. 1–3, a single heat sink 32 is employed to provide heat dissipation from both the microprocessor package 14 and the memory modules 18. But in other embodiments more than one heat sink may be used. For example, FIG. 3A is a schematic side cross-sectional view of an alternative embodiment that includes the LGA socket 10. In the embodiment of FIG. 3A, as in the embodiment of FIGS. 1–3, the microprocessor package 14 is installed in the central slot 12 of the LGA socket 10, and a respective memory module 18 is installed in each one of the memory module slots 16-1, 16-2, 16-3, 16-4 (slots 16-2, 16-4 not shown in FIG. 3A). In the embodiment of FIG. 3A, a main heat sink 38 is provided to clamp the microprocessor package 14 in place in central slot 12 and to dissipate heat from the microprocessor package 14; also a first additional heat sink 40 is provided to clamp respective memory modules 18 in slots 16-1, 16-2 and to dissipate heat from those two memory modules; and a second additional heat sink 42 is provided to clamp respective memory modules 18 in slots 16-3, 16-4 and to dissipate heat from those two memory modules.

The embodiment of FIG. 3A may avoid a possible disadvantage of the embodiment of FIGS. 1–3, in that in the embodiment of FIGS. 1–3 it is possible that the single heat sink 32 may conduct heat from the microprocessor package 14 to the memory modules 18.

Figure 4:
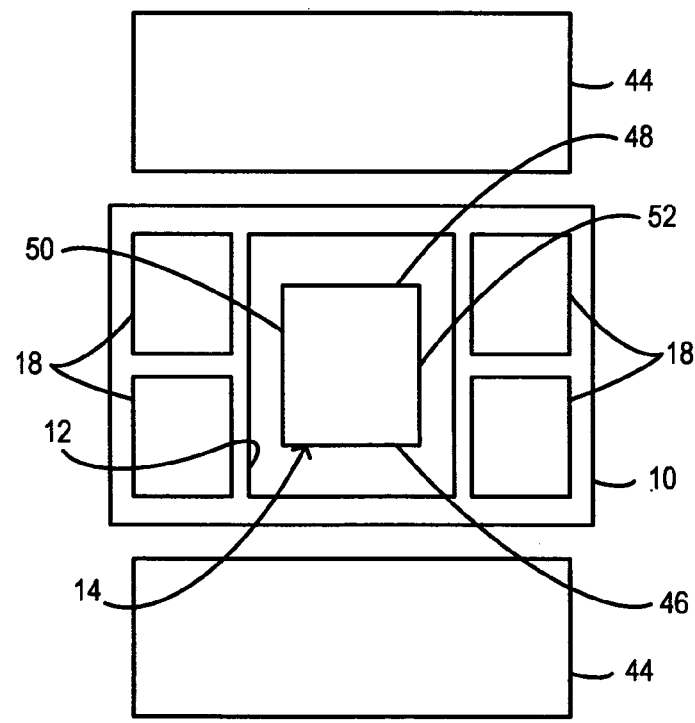
FIG. 4 is a schematic plan view showing the socket of FIG. 1 as installed on a circuit board with voltage regulator circuitry.

FIG. 4 is a schematic plan view showing the LGA socket 10 as installed on a circuit board (not shown) with voltage regulator circuitry 44 on opposite sides of the LGA socket 10. The voltage regulator circuitry 44 may be provided to supply the power requirements for the microprocessor (not separately shown) that is included in the microprocessor package 14 and also for the memory modules 18. In this particular embodiment the voltage regulator circuitry 44 may adjoin opposite sides 46, 48 of the microprocessor package 14. These sides 46, 48 adjacent the voltage regulator circuitry 44 are, in this embodiment, different from the opposite sides 50, 52 of the microprocessor package which adjoin the memory modules 18.

It will be appreciated that a process for assembling the embodiment of FIGS. 1–3 may include providing the LGA socket 10, installing the microprocessor package 14 in the central slot 12 of the LGA socket 10, and installing a respective one of the memory modules 18 in each one of the slots 16-1, 16-2, 16-3, 16-4. The process for assembling the embodiment of FIGS. 1–3 may also include positioning a respective spacer/heat spreader (34 or 36) on each pair of adjacent slots 16 and then securing the heat sink 32 to the LGA socket 10 to clamp the microprocessor package 14 and the memory modules 18 in their slots. The securing of the heat sink 32 may be by screws that are not shown. It will also be appreciated that the process for assembling the embodiment of FIGS. 1–3 may also include, at an appropriate stage, mounting the LGA socket 10 on a circuit board (not shown) such as a motherboard.

A process for assembling the embodiment of FIG. 3A may be similar to the process described in the preceding paragraph, except that the spacer/heat spreaders may be dispensed with, the main heat sink 38 may be secured to the LGA socket 10 to clamp the microprocessor package in place, and each of the additional heat sinks 40, 42 may be secured to the LGA socket 10 to clamp in place a respective adjacent pair of the memory modules 18.

In addition to saving motherboard space, as noted above, the LGA socket 10 may also aid in saving cost for items that may otherwise be needed, such as heat sinks, socket retention structures and connectors. Further, using the multi-slot LGA socket as described herein, or any other socket with slots to accommodate both microprocessor and memory ICs, may simplify system thermal design. A multi-slot socket like that described hereinabove may be particularly useful in small form factor computing devices.

Figure 5:
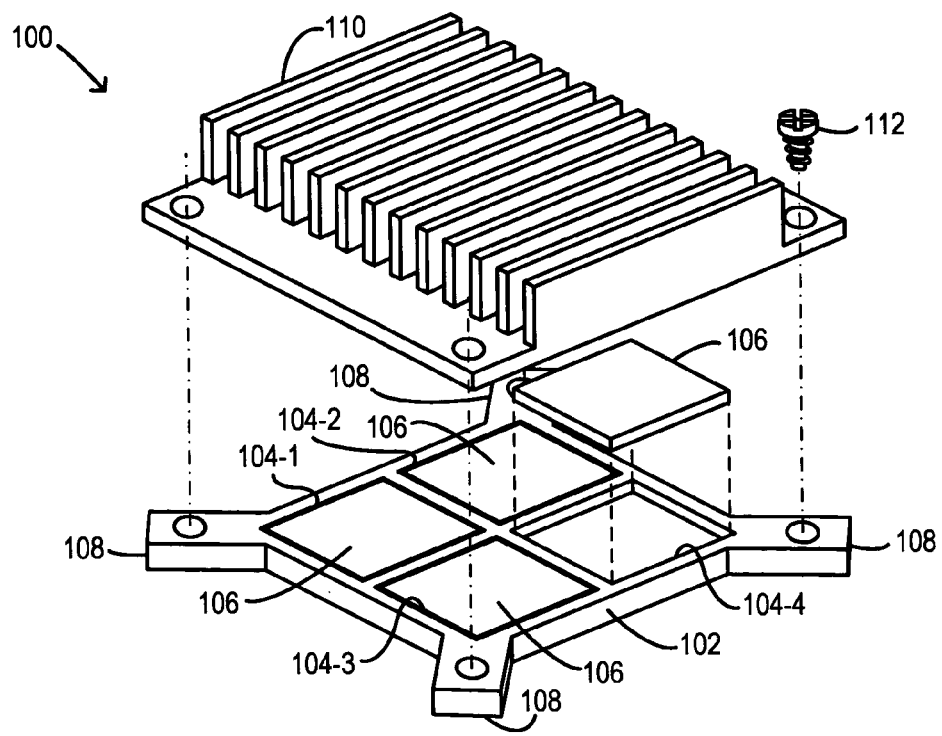
FIG. 5 is a partially exploded view of a socket assembly according to some other embodiments.

FIG. 5 is a partially exploded view of a socket assembly 100 according to some other embodiments. The socket assembly 100 includes an LGA socket 102. The LGA socket 102 includes four slots 104-1, 104-2, 104-3, 104-4 arranged in a two-by-two array. All four of the slots 104-1, 104-2, 104-3, 104-4 may be substantially identical to each other, and each may be shaped and sized to receive a respective memory module 106. Thus each slot 104-1, 104-2, 104-3, 104-4 may be formed as a rectangular recess in the LGA socket 102 and may have a floor which has thereon contact fingers (not separately shown) or the like such as are conventionally provided in LGA sockets. A respective connector receptacle 108 may be formed at each corner of the LGA socket 102.

The socket assembly 100 may include four memory modules 106, each installed in a respective one of the slots 104-1, 104-2, 104-3, 104-4. In some embodiments, the memory modules 106 may be conventional. For example, each memory module 106 may include a package in which two or more DRAM dies (not shown) are stacked.

The socket assembly 100 may also include a heat sink 110 to be secured to the LGA socket 102. The heat sink 110 may be secured to the LGA socket 102 by connectors, such as screws 112 (only one shown in FIG. 5), to be engaged with connector receptacles 108 of the LGA socket 102.

Figure 6:
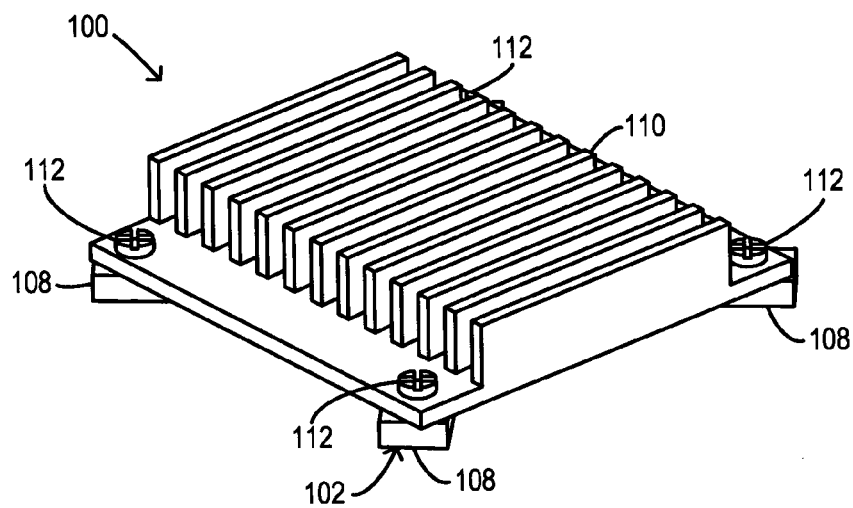
FIG. 6 is an isometric view showing the socket assembly of FIG. 5 in assembled form.

FIG. 6 is an isometric view showing the socket assembly 100 in assembled form. The heat sink 110, now secured to the LGA socket 102, covers the slots 104 (not shown in FIG. 6) and serves to clamp the memory modules 106 (not shown in FIG. 6) in the slots 104 to assure positive electrical coupling between contacts (not shown) on the memory modules 106 and contacts (not shown) in the slots 104 of the LGA socket 102. The heat sink 110 may also, of course, serve to dissipate heat from the memory modules 106. In some embodiments, the socket assembly 100 may be mounted on a circuit board (not shown) via the rear side (not shown) of the LGA socket 100. This may result in a particularly space efficient arrangement for mounting memory on a circuit board.

A process for assembling the socket assembly 100 may include providing the LGA socket 102, and installing a respective one of the memory modules 106 in each of the slots 104-1, 104-2, 104-3, 104-4. The process for assembling the socket assembly 100 may also include securing the heat sink 110 to the LGA socket 102 with screws 112 to clamp the memory modules 106 in the slots 104. The process for assembling the socket assembly 100 may also include, at an appropriate stage, mounting the LGA socket 102 on a circuit board (not shown) such as a motherboard.

Figure 7:
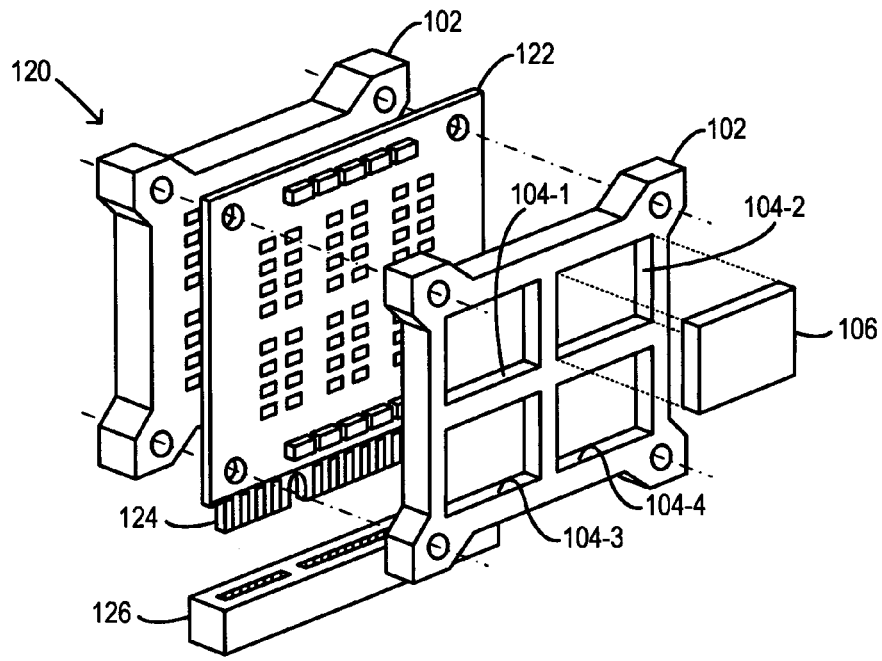
FIG. 7 is a partial exploded view of a memory assembly provided according to some embodiments and including the socket shown in FIG. 5.

FIG. 7 is a partial exploded view of a memory assembly 120 provided in accordance with some embodiments. The memory assembly 120 may include two LGA sockets 102, of the type described above, mounted back-to-back on a riser card 122, with the riser card 122 sandwiched between the LGA sockets 102. Thus one of the LGA sockets 102 is mounted on an opposite side of the riser card 122 from the other LGA socket 102.

The memory assembly 120 may also include a respective memory module 106 installed in each of the slots 104 of the LGA sockets 102. Thus the memory assembly 120 may include, in some embodiments, eight memory modules 106. Although not shown in FIG. 7, the memory assembly 120 may also include two heat sinks, each secured to a respective one of the two LGA sockets 102 to clamp in the slots of the LGA sockets the four memory modules installed in the sockets and to dissipate heat from the memory modules.

The riser card 122 may have an edge connector 124 by which the memory assembly 120 may be coupled to a connector 126 which may be mounted on a circuit board, which is not shown. This arrangement may allow for installation of memory devices on a minimal surface area of the circuit board, and with high density of memory devices.

Figures 8, 9:
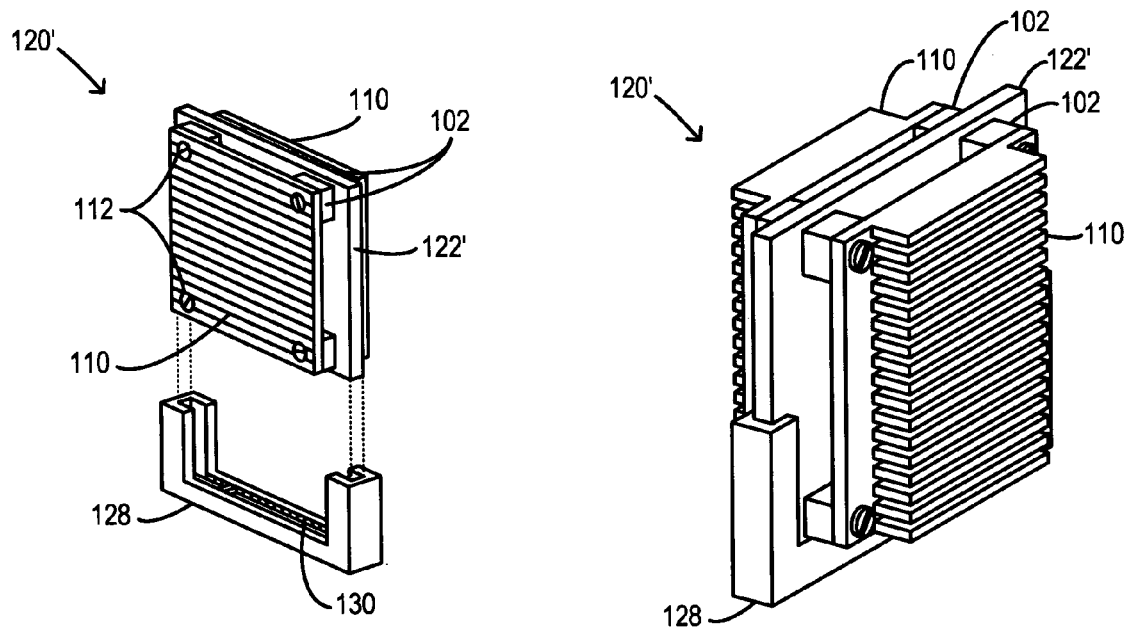
FIG. 8 is a partially exploded view of another embodiment of a memory assembly that includes the socket of FIG. 5.
FIG. 9 is an isometric view that shows the memory assembly of FIG. 8 in assembled form.

FIG. 8 is a partially exploded view of another embodiment of a memory assembly, indicated by reference numeral 120'. The memory assembly 120' may include a riser card 122' which is somewhat different from the riser card 122 shown in FIG. 7. The memory assembly 120' may also include two LGA sockets 102 (like those described above), each mounted on a respective side of the riser card 122'. Memory modules (not visible in FIG. 8) may be installed in the slots of the LGA sockets 102, and a respective heat sink 110 may be secured by fasteners 112 to each of the LGA sockets 102.

Figure 10:
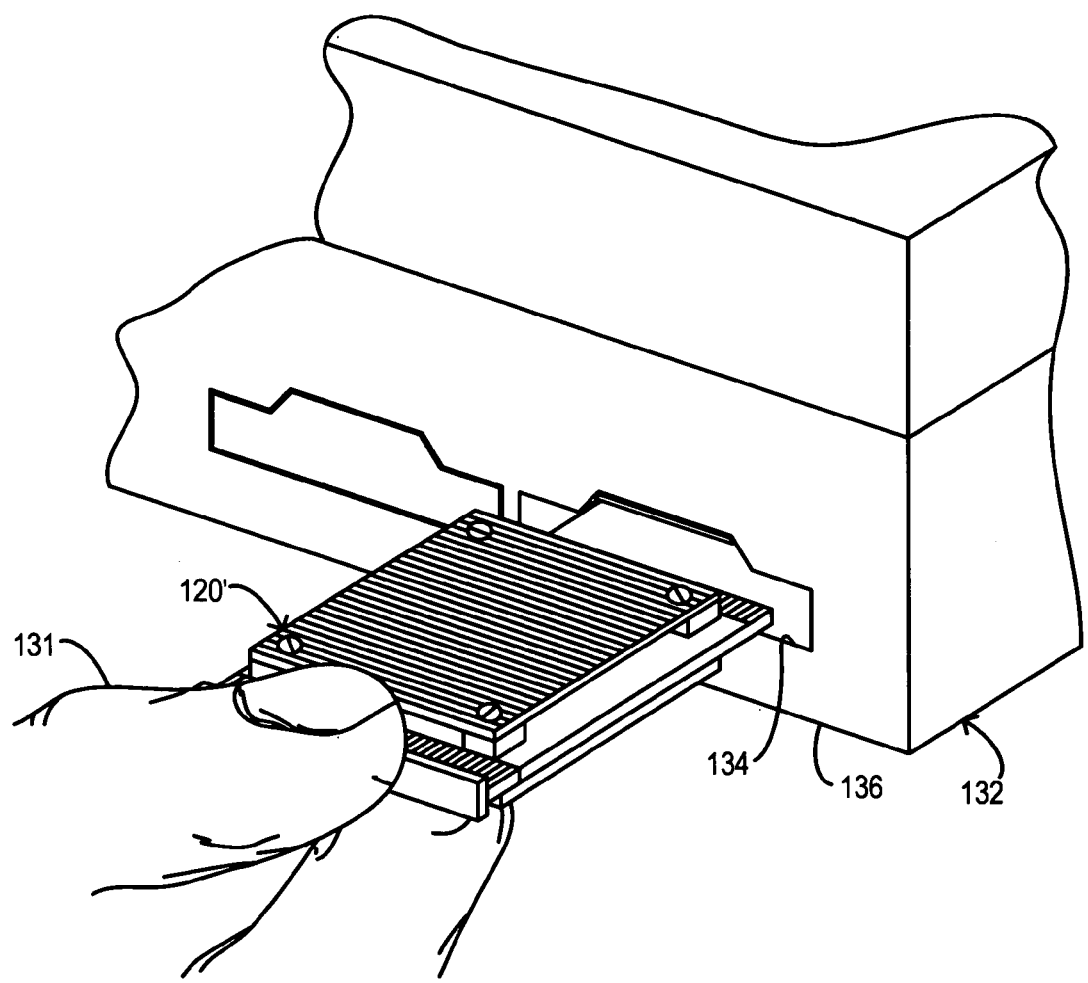
FIG. 10 is an isometric view that shows the memory assembly of FIGS. 8 and 9 being inserted in a personal computer housing as a user upgrade option.

The memory assembly 120' may also include a holder 128, which may be generally U-shaped and which may include a U-shaped slot 130 to receive an edge 132 of the riser card. The memory assembly 120', shown assembled in FIG. 9, may be used as an upgrade memory assembly, to be installed by the user 131 in a personal computer 132, as shown in FIG. 10. More specifically, the memory assembly 120' may be inserted by the user in an exterior slot 134 in the housing 136 of the personal computer 132 in order to perform an end-user memory upgrade.

The memory modules installed in LGA sockets as described herein may be DRAM or may alternatively be other types of memory. The memory modules may be 8 gigabit modules or may be of any other capacity.

In some embodiments, in addition to or instead of clamping the IC packages in the LGA socket slots with a heat sink and screws, the LGA socket may include a clamp, a mechanical lever and/or a latch to secure the IC packages in place in the slots and in electrical contact with contacts in the LGA socket.

The numbers, configurations and/or shapes of slots provided in LGA sockets in some embodiments may differ from the numbers/configurations/shapes of slots shown in the LGA sockets illustrated herein. For example, there may be more or fewer than four memory module slots in a single LGA socket.

With the socketized memory modules provided for in above-described embodiments, a personal computer which incorporates such sockets may have an external door (not shown) by which memory may be accessed for replacement/upgrade etc. Thus in such embodiments, it may not be necessary to disassemble the PC housing to replace/upgrade memory.

As used herein and in the appended claims, "microprocessor package" refers to an IC package which houses a microprocessor. As used herein and in the appended claims, "memory module" refers to a packaged memory device and/or to a packaged stacked arrangement of memory devices.

In the above-described embodiments, LGA sockets are used, but in other embodiments other types of sockets may be used.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An apparatus comprising:
   a circuit board;
   a socket mounted on the circuit board, the socket including a first slot, a second slot, a third slot, a fourth slot and a fifth slot, the first slot at a central location in the socket, the second and third slots adjacent to each other and adjacent to a first side of the first slot, the fourth and fifth slots adjacent to each other and adjacent to a second side of the first slot that is opposite to the first side of the first slot;
   a microprocessor installed in the first slot;
   a first memory module installed in the second slot;
   a second memory module installed in the third slot;
   a third memory module installed in the fourth slot; and
   a fourth memory module installed in the fifth slot;
   wherein the socket provides data and addressing connections between the microprocessor and the memory modules, such that a trace routing that is required on the circuit board to connect the microprocessor to the memory modules is reduced.

2. The apparatus of claim 1, wherein the memory modules are DRAM (dynamic random access memory) modules.

3. The apparatus of claim 1, wherein the microprocessor is integrated with a memory controller.

4. The apparatus of claim 1, wherein the socket is an LGA (land grid array) socket.

5. An apparatus comprising:
   a computer which includes a housing, the housing including an external slot formed in the housing;
   a memory assembly inserted in the external slot of the housing, the memory assembly including:
     a riser card;
     a first socket mounted on a first side of the riser card, the first socket including four slots in a two-by-two array, the four slots including a first slot, a second slot, a third slot and a fourth slot;
     a second socket mounted on a second side of the riser card, the second side of the riser card facing in an opposite direction from the first side of the riser card, the second socket including four slots in a two-by-two array, the four slots of the second socket including a fifth slot, a sixth slot, a seventh slot and an eighth slot;
     a first memory module mounted in the first slot;
     a second memory module mounted in the second slot;
     a third memory module mounted in the third slot;
     a fourth memory module mounted in the fourth slot;
     a fifth memory module mounted in the fifth slot;
     a sixth memory module mounted in the sixth slot;
     a seventh memory module mounted in the seventh slot;
     an eighth memory module mounted in the eighth slot;
     a first heat sink that clamps the first, second, third and fourth memory modules in the slots of the first socket;
     a second heat sink that clamps the fifth, sixth, seventh and eighth memory modules in the slots of the second socket; and
     a U-shaped holder that includes a U-shaped slot in which an edge of the riser card is received.

6. The apparatus of claim 5, wherein the sockets are LGA (land grid array) sockets.

7. The apparatus of claim 5, wherein the memory modules are DRAM (dynamic random access memory) modules.

* * * * *